(12) United States Patent
Jung

(10) Patent No.: US 6,346,462 B1
(45) Date of Patent: *Feb. 12, 2002

(54) METHOD OF FABRICATING A THIN FILM TRANSISTOR

(75) Inventor: Yun-Ho Jung, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/603,883

(22) Filed: Jun. 26, 2000

(30) Foreign Application Priority Data

Jun. 25, 1999 (KR) .............................. 99-24158

(51) Int. Cl.[7] .......................... H01L 21/36; H01L 21/84
(52) U.S. Cl. ...................... 438/486; 438/162; 438/166
(58) Field of Search ................................ 438/486, 487, 438/795, 166, FOR 268, 261, 484, 162, 163, FOR 333, 188; 117/8

(56) References Cited

U.S. PATENT DOCUMENTS

| | | | |
|---|---|---|---|
| 4,693,759 A | * | 9/1987 | Noguchi et al. |
| 6,015,720 A | * | 1/2000 | Minegishi et al. |
| 6,104,040 A | * | 8/2000 | Kawachi et al. |
| 6,177,301 B1 | * | 1/2001 | Jung |
| 6,204,101 B1 | * | 3/2001 | Yamazaki et al. |
| 6,204,520 B1 | * | 3/2001 | Ha et al. |

FOREIGN PATENT DOCUMENTS

| | | | |
|---|---|---|---|
| GB | 2338343 A | * | 12/1999 |
| JP | 410041522 A | * | 2/1998 |

OTHER PUBLICATIONS

Crowder et al., Low Temperature Single–crystal Si TFT's Fabricated on Si Films Process via Sequential Lateral Solidification, Aug. 1998, IEEE Electon Device Letters, vol. 19, No. 8, pp. 306–308.*

* cited by examiner

Primary Examiner—George Fourson
Assistant Examiner—Thanh V. Pham
(74) Attorney, Agent, or Firm—Long Aldridge & Norman, LLP

(57) ABSTRACT

A method of fabricating a thin film transistor with a silicon film crystallized by sequential lateral solidification including depositing an amorphous silicon film on an insulating substrate, selectively doping the amorphous silicon film with impuities, crystallizing the amorphous silicon film doped selectively with the impurities by sequential lateral solidification, forming an active layer of which doped portions become source and drain regions by patterning the silicon film crystalized by sequential lateral solidification, and forming a gate insulating layer and a gate electrode on the active layer.

11 Claims, 12 Drawing Sheets

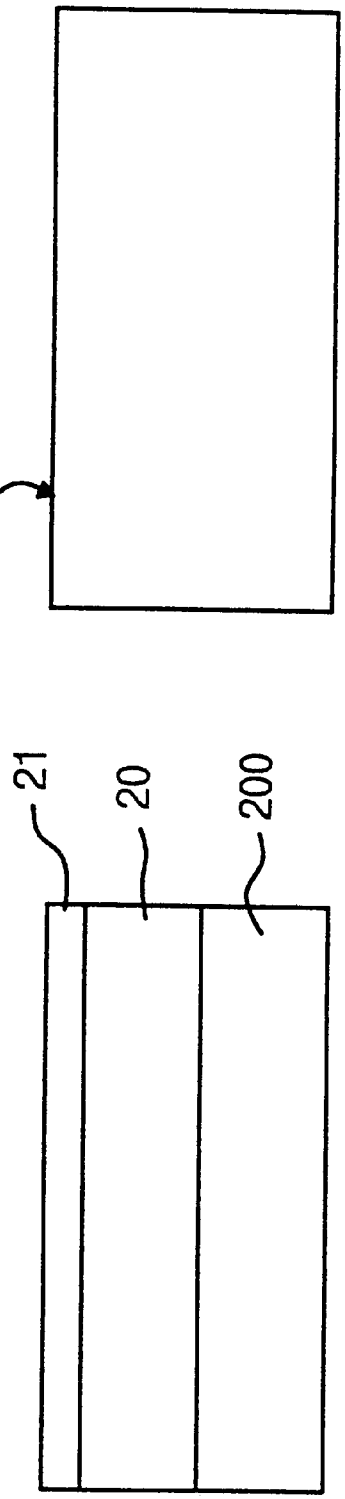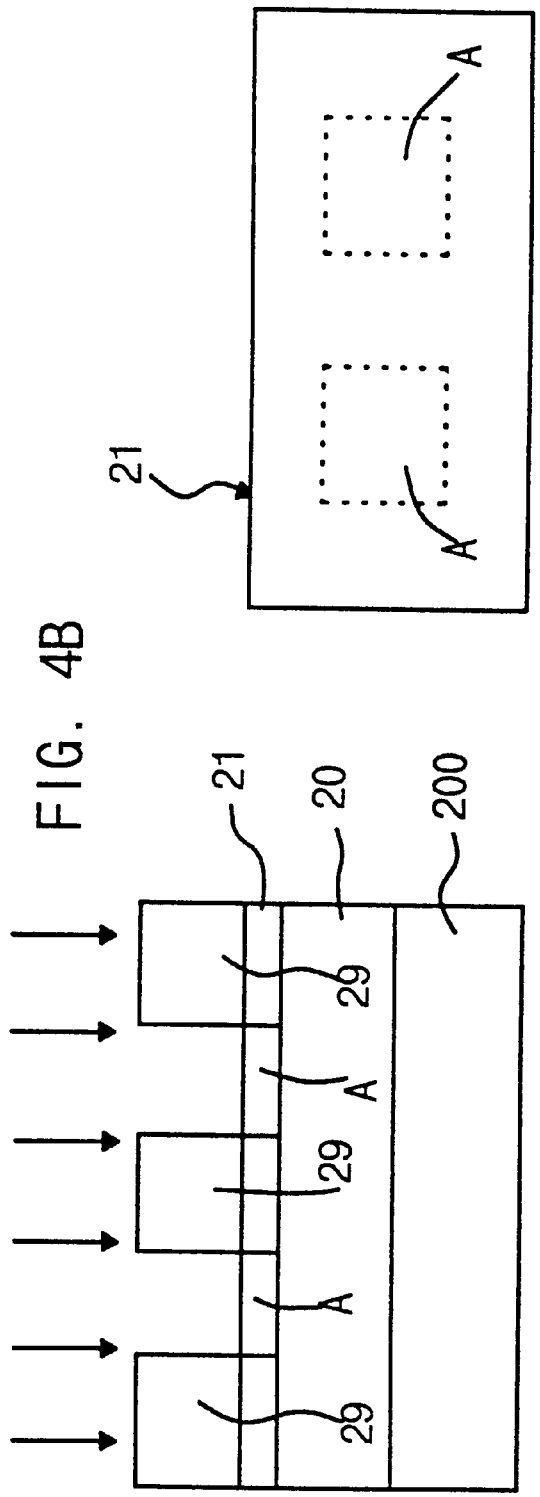
FIG. 4A
FIG. 4B

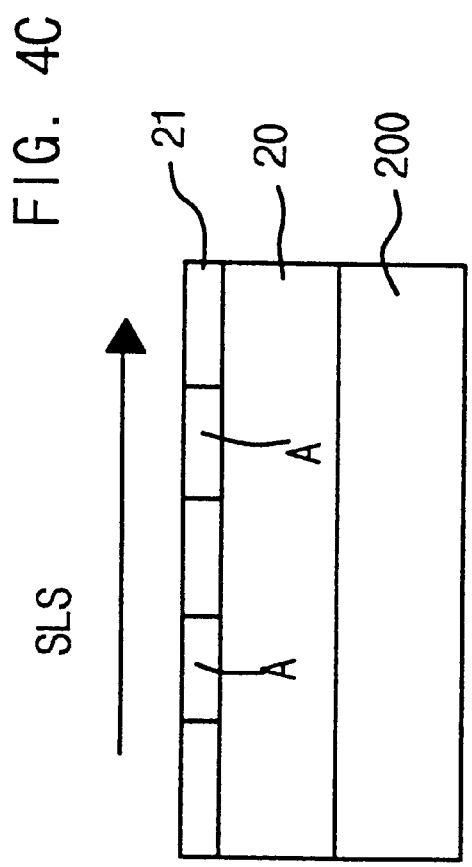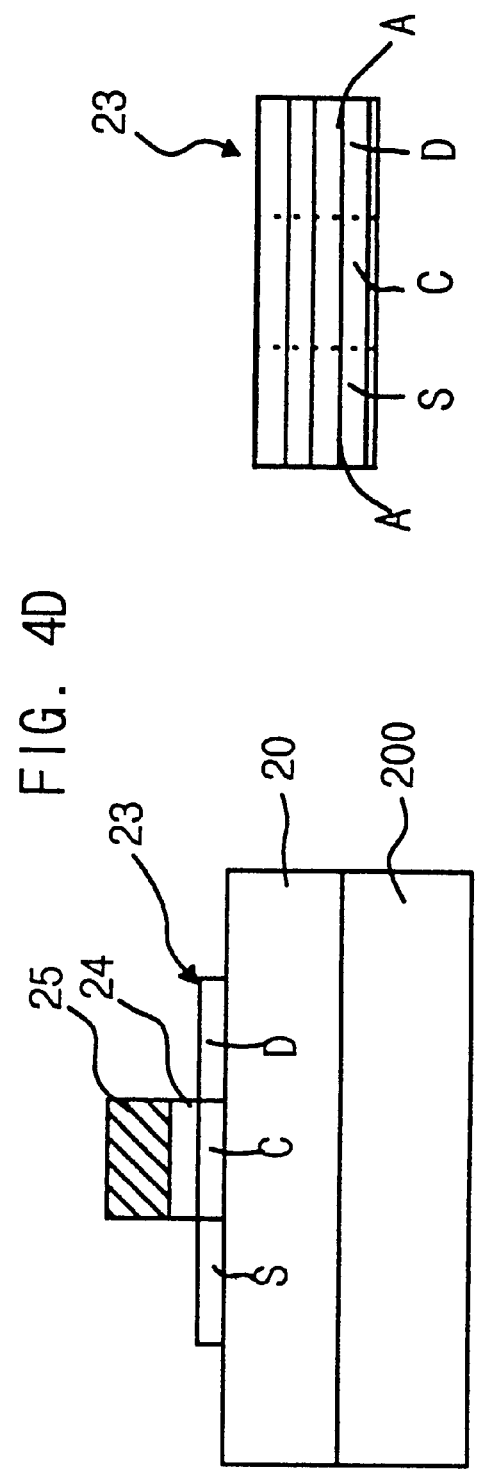
FIG. 4C
FIG. 4D

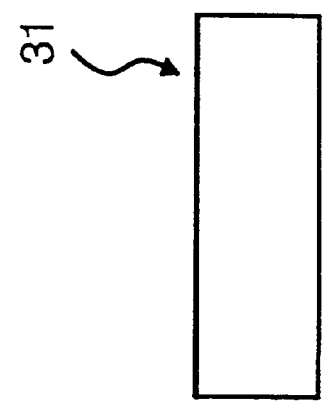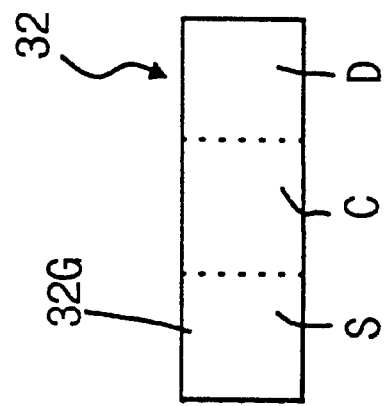
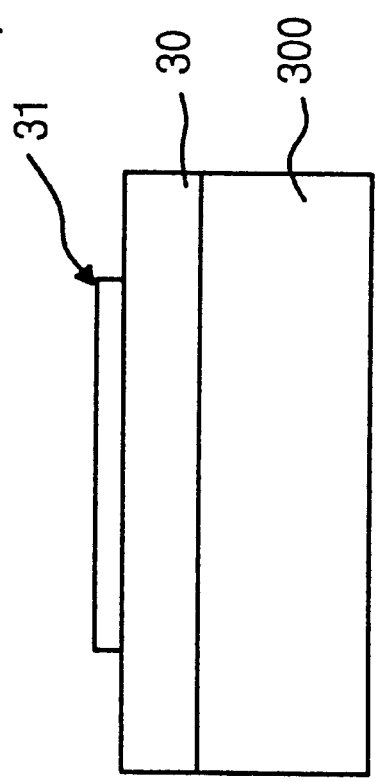
FIG. 5A
FIG. 5B

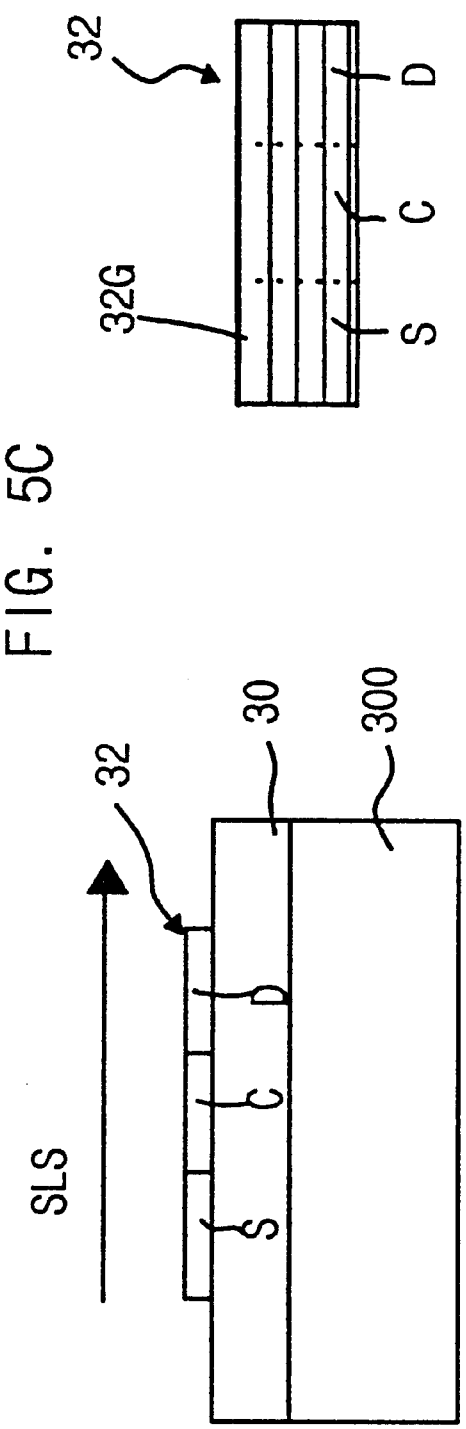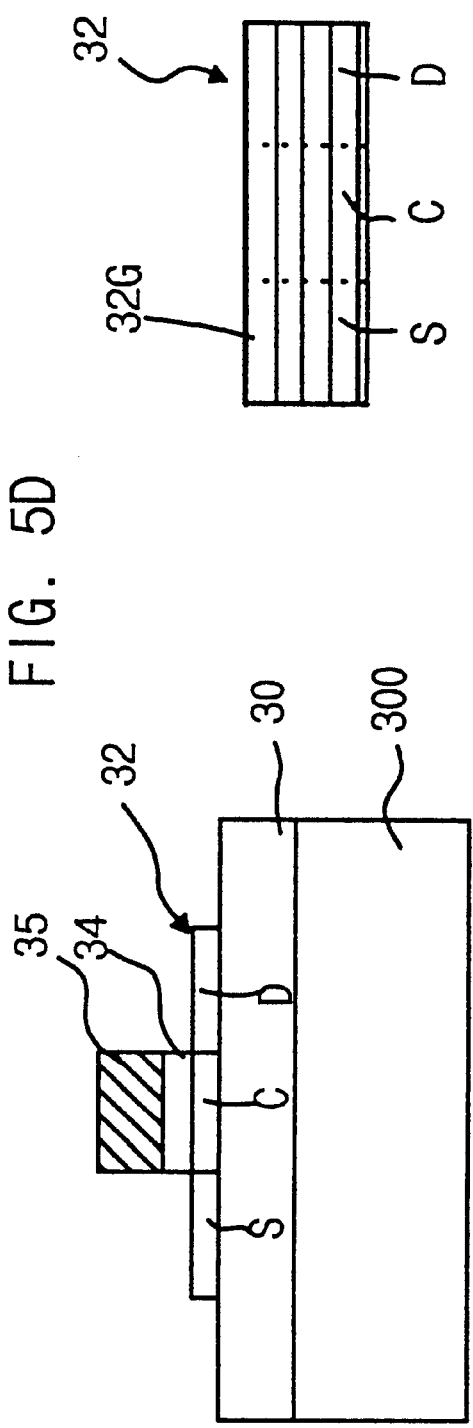

US 6,346,462 B1

METHOD OF FABRICATING A THIN FILM TRANSISTOR

This application claims the benefit of Korean Patent Application No. 1999-24158, filed on Jun. 25, 1999, which is hereby incorporated by reference.

BACKGROUND OF THE INVENTION

1. Field of Invention

The present invention relates to a method of fabricating a thin film transistor, and more particularly, to a method of fabricating a thin film transistor having a silicon film crystallized by sequential lateral solidification.

2. Discussion of the Related Art

A silicon grain grows in a vertical direction of an interface between a liquid phase silicon region and a solid phase silicon region. Sequential Lateral Solidification (hereinafter abbreviated SLS) is a technique of crystallizing an amorphous silicon film by enhancing the size of the silicon grain, which is achieved by having the silicon grain grow laterally to a predetermined length by manipulating the displacement of the energy and irradiation range of a laser beam (Robert S. Sposilli, M. A. Crowder, and James S. Im, Mat. Res. Soc. Symp. Proc. Vol. 452, 956–957, 1997).

SLS enables the fabrication of a thin film transistor (hereinafter abbreviated TFT) having a channel region of single crystalline silicon by forming an SLS silicon film having a very large grain size on a substrate.

FIGS. 1A to FIGS. 1D show steps of fabricating a TFT according to a related art. The left sides of FIGS. 1A–1D illustrate cross-sectional views while the right sides illustrate schematic layouts of a silicon film to show the respective states of silicon.

Referring to FIG. 1A, a buffer layer 10 of silicon oxide is deposited on an insulated substrate 100. Then, an amorphous silicon film 11 is deposited on the buffer layer 10.

Referring to FIG. 1B, the amorphous silicon film 11 is crystallized by SLS to form an SLS silicon film 12 having silicon grains 12G which are grown to an enormous size. The SLS silicon film 12 is attained by having the silicon grains 12G grow to a specific direction. In the drawing, the silicon grains are shown in a simplified manner.

Referring to FIG. 1C, an active layer 13 is formed by patterning the SLS silicon film 12 by photolithography. Then, a gate insulating layer 14 and a gate electrode 15 are formed on the active layer 13 by a conventional method.

Successively, a source region S and a drain region D are formed by doping the exposed portions of the active layer 13 with impurities. In this case, the source and drain regions S and D become amorphous by the impurity doping, while a channel region C of the SLS crystalline state remains intact as the gate electrode 15 blocks or masks the impurity doping.

Referring to FIG. 1D, the source and drain regions S and D [crystallized by the impurity doping] are crystallized by laser annealing for activation. As a result, the channel region C becomes crystallized by SLS, while the source and drain regions S and D become a polycrystalline state with small size silicon grains.

As mentioned in the above explanation, the source and drain regions of amorphous silicon doped with impurities undergo crystallization by laser activation. In this case, silicon crystallization by the conventional laser annealing fails to form silicon grains of large size by SLS crystallization due to its characteristics.

FIG. 2 shows a result of a silicon film which is activated by a laser of low energy after the silicon film crystallized by SLS has been doped with impurities. As shown in the drawing, the state of the silicon film is amorphous.

FIG. 3 shows another result of a silicon film which is activated by another laser of high energy after the silicon film crystallized by SLS according to the related art has been doped with impurities. As shown in the drawing, it is difficult to apply the silicon film to fabricate devices due to many small-sized silicon grains even though the silicon film is crystallized. As mentioned in the above explanation, source and drain regions of amorphous silicon or polycrystalline silicon of which grain size is small are formed by the related art.

As a result, silicon characteristics of the channel region of the TFT fabricated by the related art differ from those of the impurity region such as the source or drain region, reducing mobility of carriers due to non-uniformity of the characteristics. Thus, characteristics of the TFT become poor.

When activation is carried out by a conventional method of furnace annealing after the impurity doping, re-crystallization of the active layer never occurs since the insulating substrate limits raising of the annealing temperature. Therefore, the source and drain regions remain amorphous, causing problems.

Moreover, it is desirous to simplify the related art which includes a step of crystallizing an initial amorphous silicon and another step of activating an active layer which has become amorphous by the impurity doping.

SUMMARY OF THE INVENTION

Accordingly, the present invention is directed to a method of fabricating a thin film transistor that substantially obviates one or more of the problems due to limitations and disadvantages of the related art.

An object of the present invention is to provide a method of fabricating a TFT which improves the characteristics of the TFT by carrying out impurity doping of the source and drain regions before the formation of a gate electrode.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of depositing an amorphous silicon film on an insulating substrate, selectively doping the amorphous silicon film with impurities, crystallizing the amorphous silicon film selectively doped with the impurities by sequential lateral solidification, forming an active layer of which doped portions become source and drain regions by patterning the silicon film crystallized by sequential lateral solidification, and forming a gate insulating layer and a gate electrode on the active layer.

In another aspect, the present invention includes the steps of depositing an active layer of amorphous silicon on a substrate, defining source and drain regions in the active layer by selectively doping the active layer with impurities, crystallizing the active layer of amorphous silicon selectively doped with the impurities by sequential lateral solidification, forming a gate insulating layer and a gate electrode on the active layer crystallized by sequential lateral solidification.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIGS. 4A to FIGS. 4D show steps of fabricating a TFT according to a first embodiment of the present invention;

FIGS. 5A to FIGS. 5D show steps of fabricating a TFT according to a second embodiment of the present invention;

DETAILED DESCRIPTION OF THE PREFERRED EMBODIMENTS

Figure 1A:
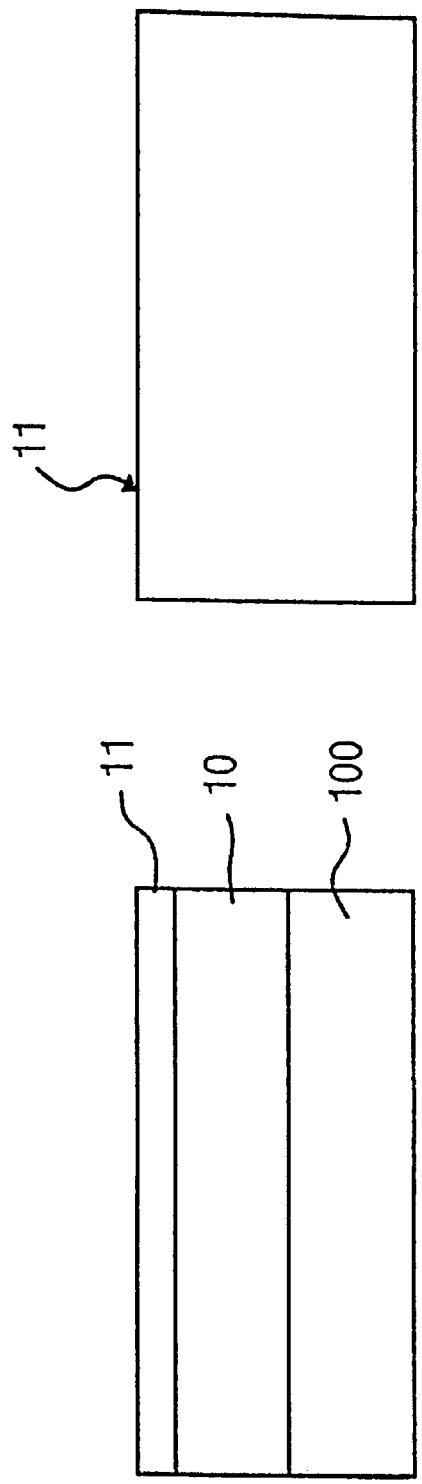
FIGS. 1A to FIGS. 1D show steps of fabricating a TFT according to a related art, where left sides illustrate cross-sectional views and right sides illustrate schematic layouts of a silicon film to show the respective states of silicon.
Figure 1B:
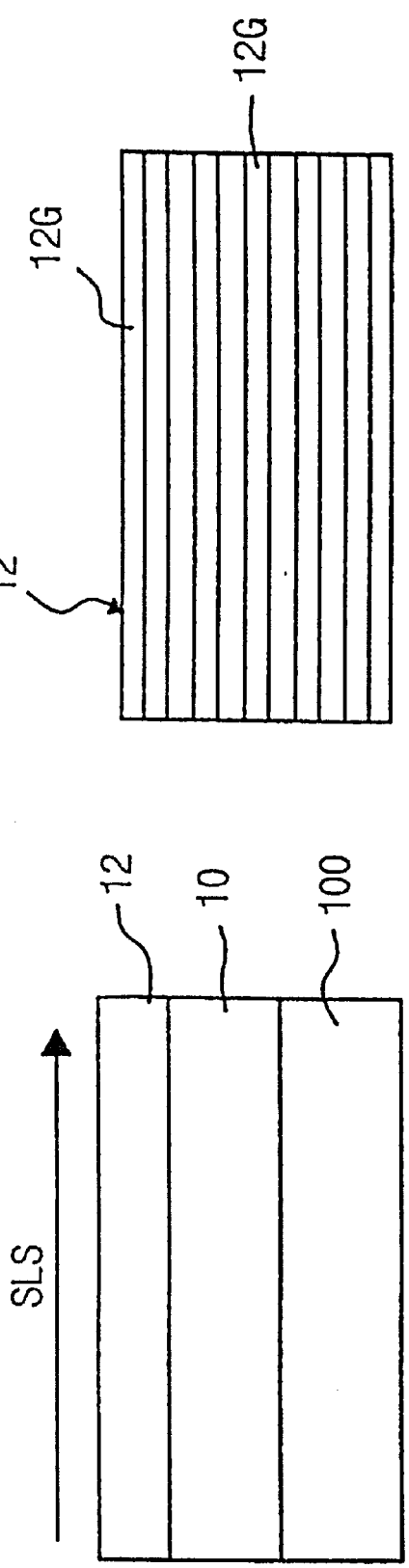
Figure 1C:
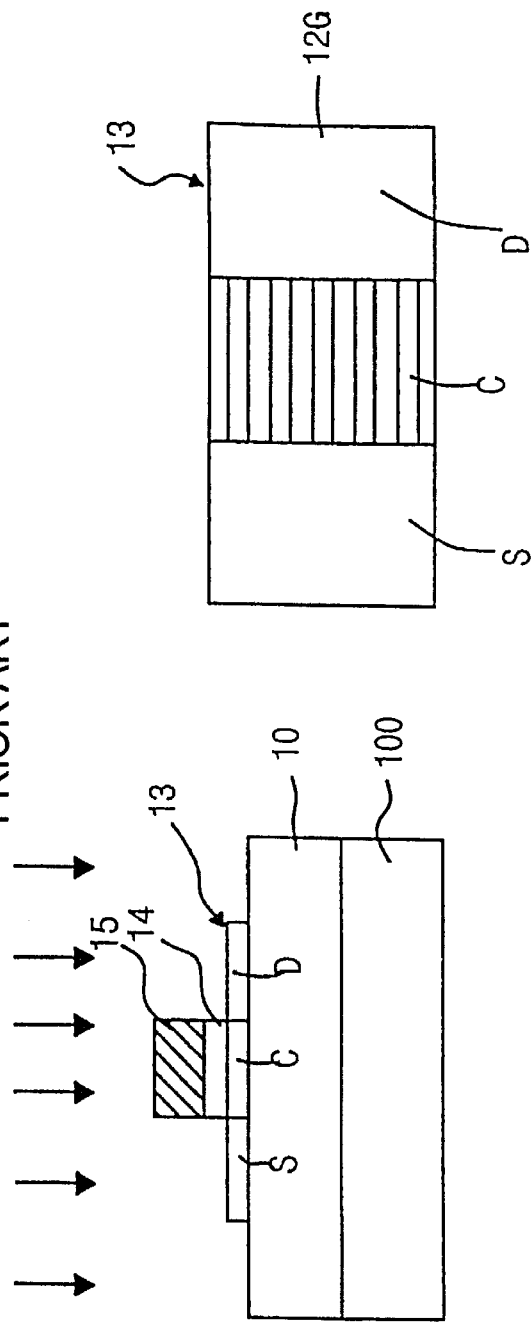
Figure 1D:
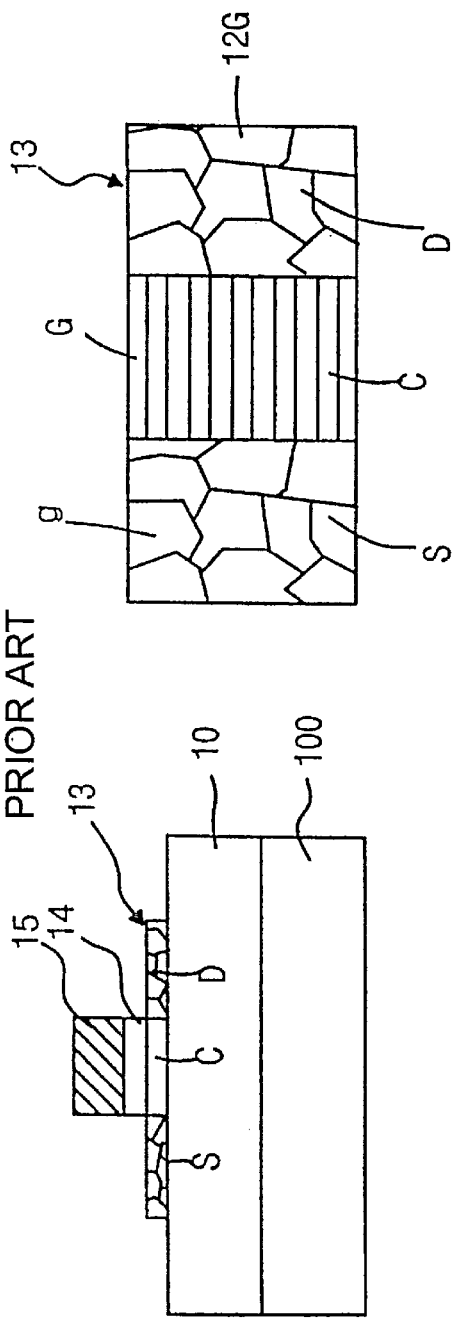
Figure 2:
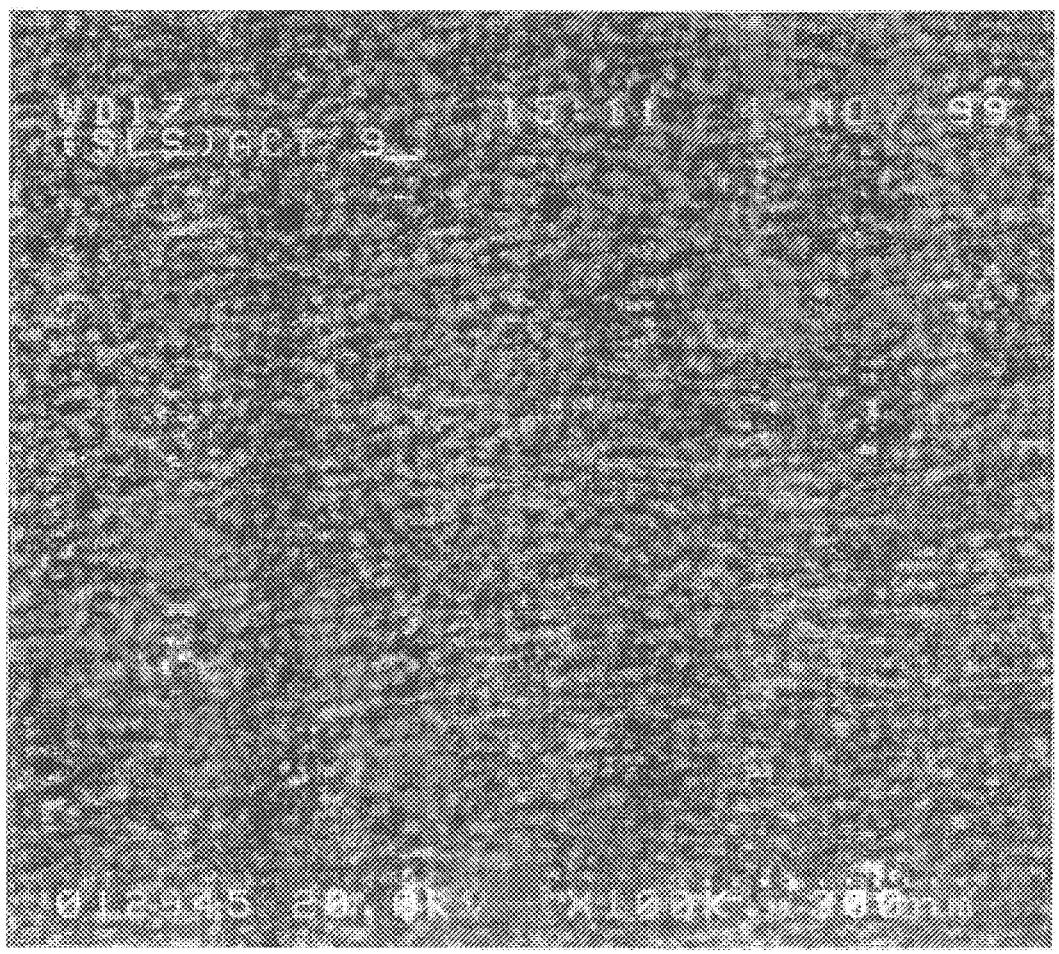
FIG. 2 shows a result of a silicon film which is activated by a laser of low energy after the silicon film crystallized by SLS has been doped with impurities.
Figure 3:
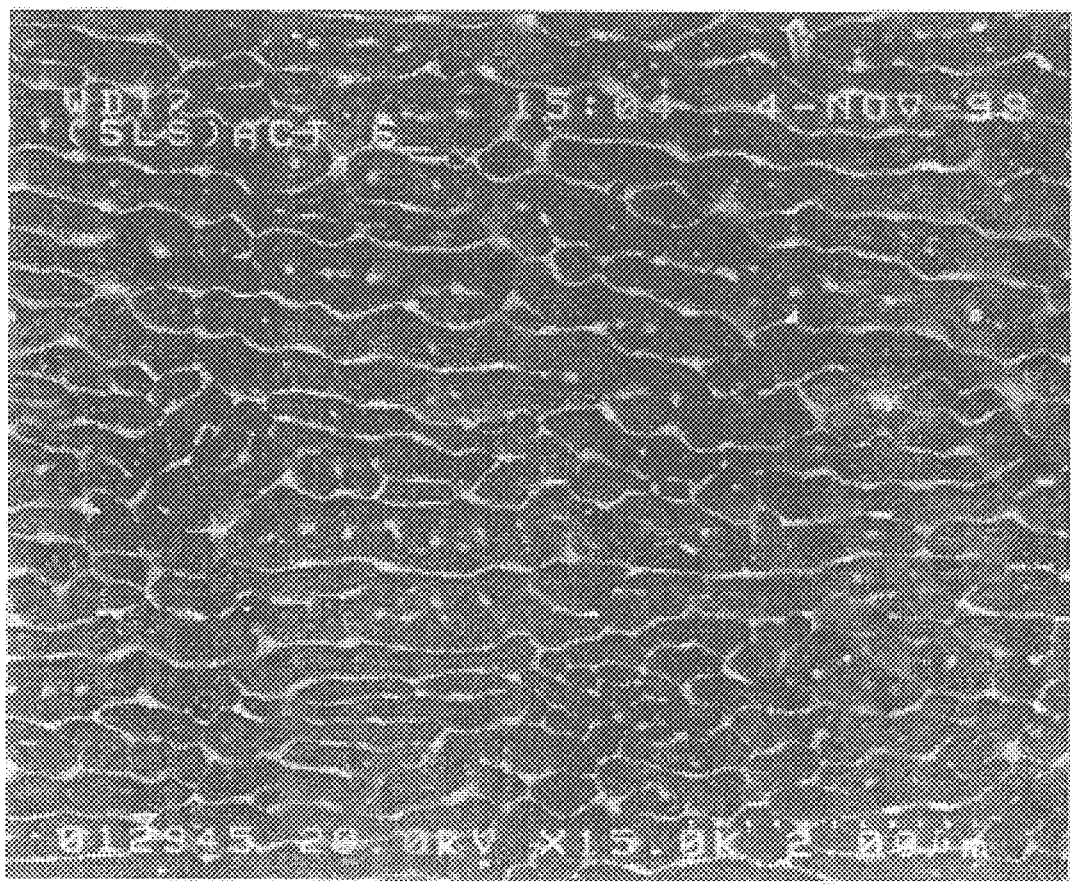
FIG. 3 shows another result of a silicon film which is activated by another laser of high energy after the silicon film crystallized by SLS according to the related art has been doped with impurities.

Reference will now be made in detail to the preferred embodiments of the present invention, examples of which are illustrated in the accompanying drawings.

FIGS. 4A to FIGS. 4D show steps of fabricating a TFT according to a first embodiment of the present invention. The left sides illustrate cross-sectional views and the right sides illustrate schematic layouts of a silicon film to show the respective states of silicon.

Referring to FIG. 4A, after a buffer layer 20 has been deposited on an insulating substrate 200, an amorphous silicon film 21 is deposited on the buffer layer 20. The buffer layer 20 prevents deterioration of the silicon film during crystallization. In particular, particles on the insulating substrate 200 penetrates into the silicon film during crystallization of the amorphous silicon film. The buffer layer 20 is preferably formed by depositing silicon oxide or silicon nitride by APCVD or PECVD.

Referring to FIG. 4B, a blocking layer 29 selectively exposing portions A defining source and drain regions of a thin film transistor (hereinafter abbreviated TFT) is formed on the amorphous silicon film 21. The blocking layer 29 is preferably formed with a conventional insulating layer such as photoresist, silicon oxide, silicon nitride and the like.

Subsequently, the portions defining the source and drain regions are doped by implanting the substrate with impurities using the blocking layer 29 as a mask. The amorphous silicon film 21 remains amorphous on the surface of the substrate as portions A of the amorphous silicon doped with the impurities become amorphous by the impurity doping and the rest of the silicon is amorphous.

Referring to FIG. 4C, after the blocking layer 29 has been removed, the amorphous silicon film 21 doped selectively with the impurities is crystallized by SLS. As a result, the amorphous silicon film including the portions having been doped with the impurities as well as the non-doped portions is crystallized to become an SLS silicon film 22 of which silicon grains 22G grow enormously. Thus, the doped silicon is crystallized in the present invention, thereby skipping the activation step carried out after the impurity doping step in the related art.

Referring to FIG. 4D, an active layer 23 is formed by patterning the SLS silicon film 22 by photolithography. In this case, the active layer 23 is patterned to make the portions A which are doped selectively with the impurities become a source region S and a drain region D. As the source and drain regions S and D and the channel region C are crystallized by SLS, the whole active layer 23 takes on single crystalline characteristics.

Accordingly, it is possible to fabricate single crystalline silicon TFTs on the insulating substrate 200.

Then, a gate insulating layer 24 and a gate electrode 25 are formed on the active layer 23.

FIGS. 5A to 5D show steps of fabricating a TFT according to a second embodiment of the present invention. The left sides of the figures illustrate cross-sectional views of fabrication and the right sides illustrate schematic layouts of a silicon film to show the respective states of silicon.

Referring to FIG. 5A, after a buffer layer 30 has been deposited on an insulating substrate 300, an amorphous silicon film is deposited on the buffer layer 30.

Then, an active layer 31 is formed by patterning the amorphous silicon film by photolithography.

Referring to FIG. 5B, a blocking layer DB exposing selectively portions A which will become source and drain regions of a TFT is formed on the active layer 31.

Successively, portions of the active layer 31 defining the source and drain regions S and D are doped by implanting the substrate with impurities using the blocking layer DB as a mask. In this case, the channel region C as well as the source and drain regions S and D remain amorphous.

Referring to FIG. 5C, after the blocking layer DB has been removed, the exposed active layer of amorphous silicon is crystallized by SLS. As a result, the exposed active layer 31 including the channel, source and drain regions C, S and D are crystallized to become an active layer 32 of SLS silicon of which silicon grains 32G grow enormously. Thus, the doped silicon is crystallized in the present invention, thereby skipping the activation step carried out after the impurity doping step in the related art.

As the source and drain regions S and D and the channel region C are crystallized by SLS, the whole active layer 23 takes on single crystalline characteristics. Accordingly, it is possible to fabricate single crystalline silicon TFTs on the insulating substrate 300.

Referring to FIG. 5D, a gate insulating layer 34 and a gate electrode 35 are formed on the active layer 32.

Figure 6:
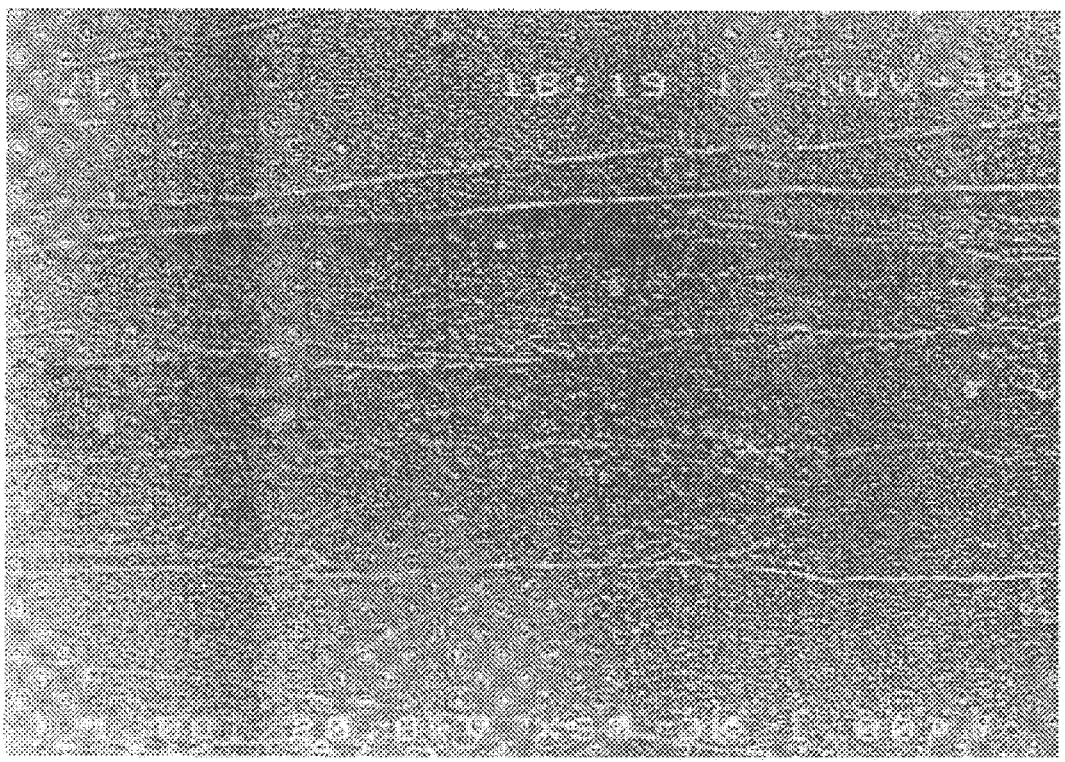
FIG. 6 shows a result of a silicon film which is crystallized by SLS according to the present invention after having been doped with impurities.

FIG. 6 shows a result of a silicon film which is crystallized by SLS according to the present invention after having been doped with impurities.

As shown in the drawing, an SLS silicon film with very large respective grain sizes is formed as silicon grains grow long laterally. This part becomes the source and drain regions of a TFT of the present invention.

Figure 7:
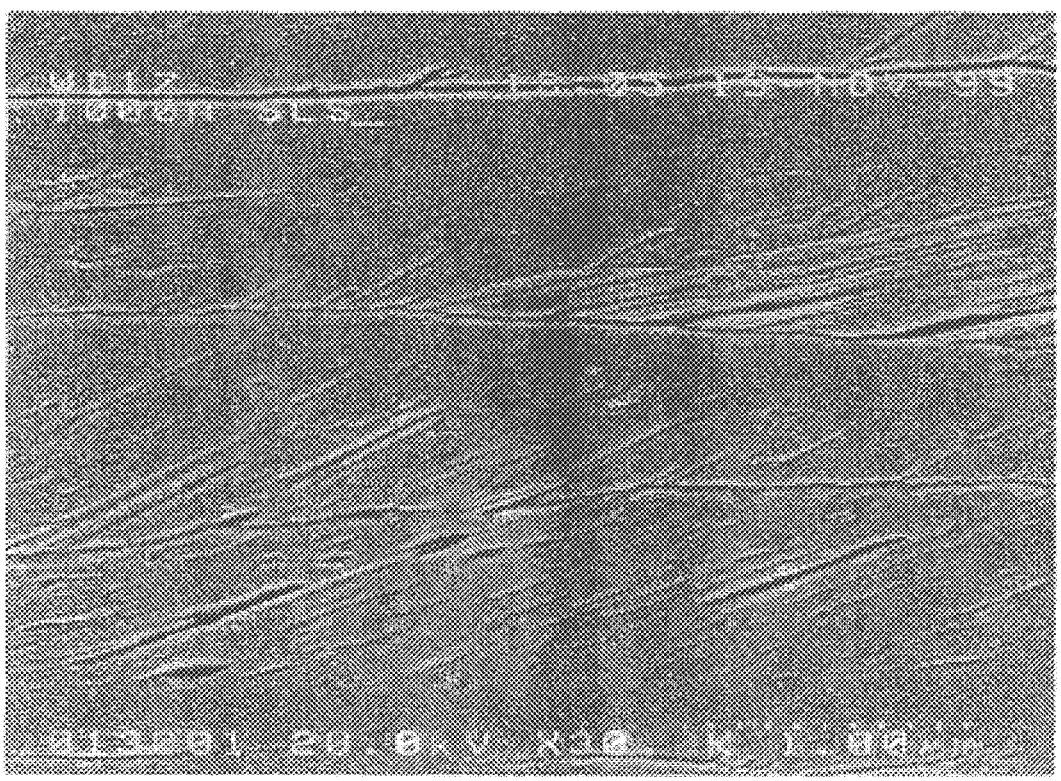
FIG. 7 shows a silicon film which is crystallized by SLS according to the present invention.

FIG. 7 shows a silicon film which is crystallized by SLS according to the present invention.

As shown in the drawing, an SLS silicon film with very large respective grain sizes is formed as silicon grains grow long laterally. This part becomes the source and drain regions of a TFT of the present invention. As mentioned in the above description, this result shows the characteristics of SLS as it is. This part becomes the channel region of a TFT of the present invention.

As shown in FIGS. 6 and 7, the source and drain regions of the TFT fabricated by the present invention have silicon film characteristics as good as the channel region.

Figure 8:
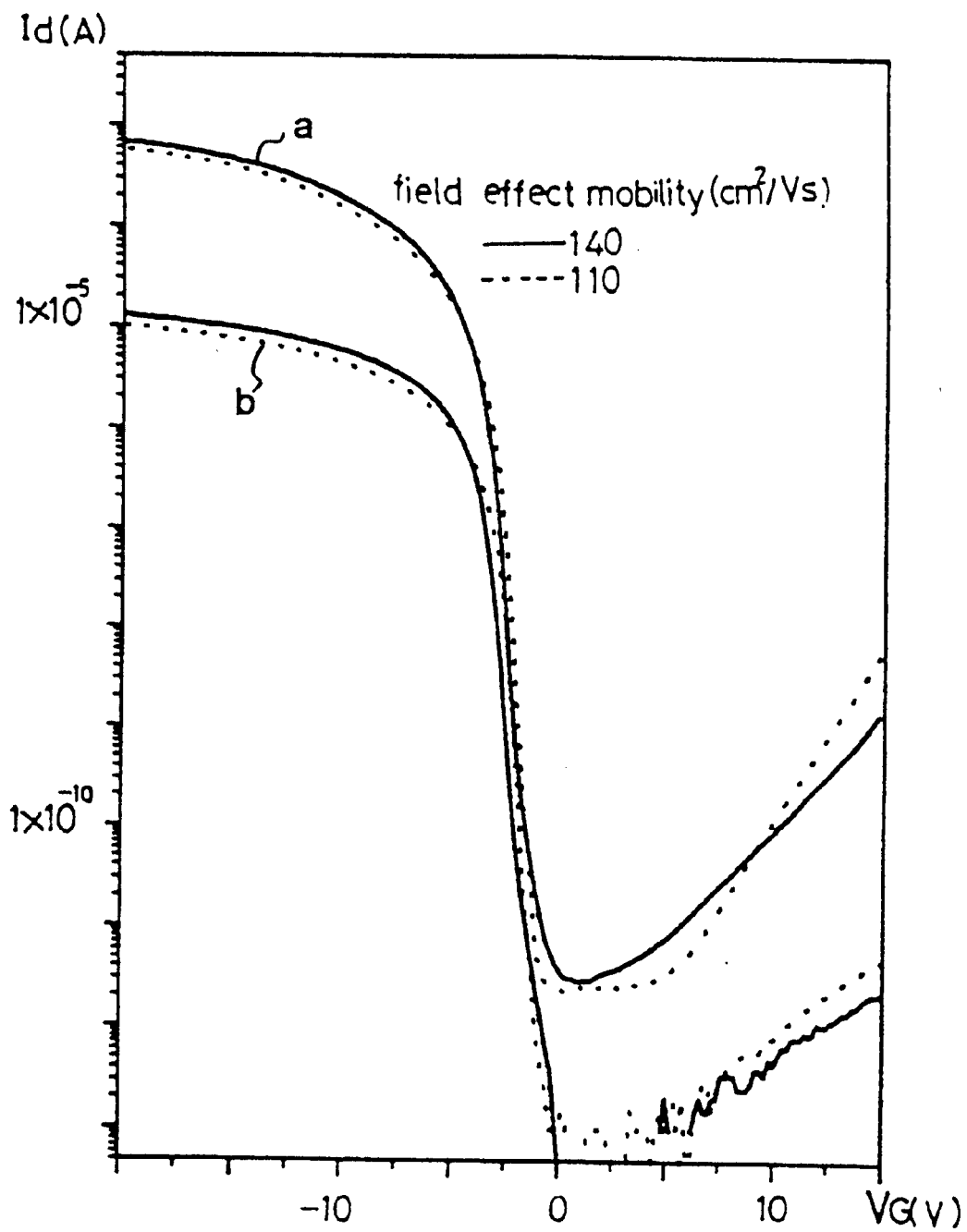
FIG. 8 shows transferring curves of p-type TFTs fabricated by the related art and the present invention, respectively.
Figure 9:
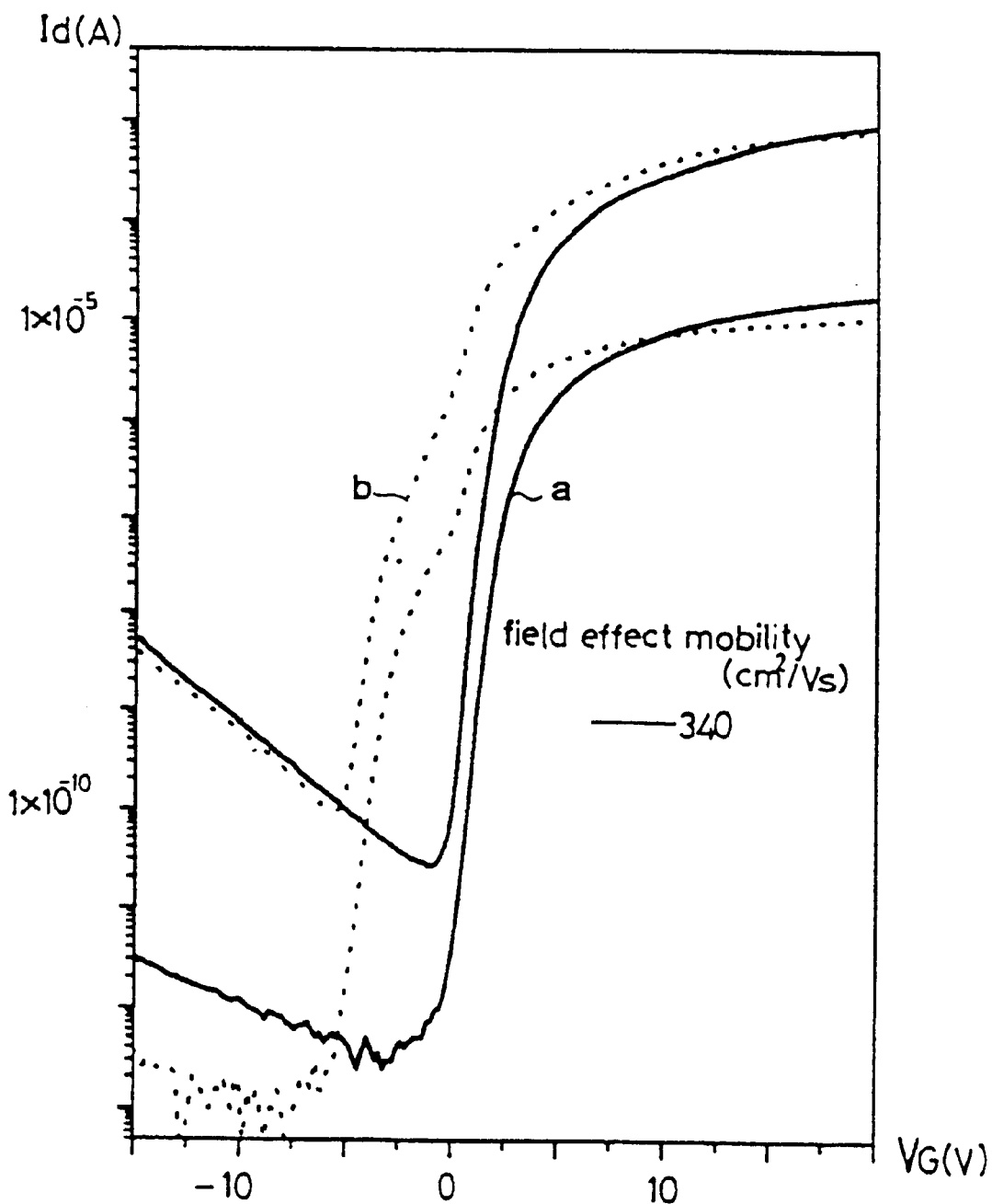
FIG. 9 shows transferring curves of n-type TFTs fabricated by the related art and the present invention, respectively.

FIGS. 8 and 9 show transferring curves of TFTs fabricated by crystallization, impurity doping and activation of a silicon film according to the related art and by impurity doping, and simultaneous activation and crystallization of a silicon film according to the present invention.

In FIGS. 8 and 9, dotted lines(b) correspond to the prior art and full lines(a) correspond to the present invention.

In particular, FIG. 8 shows transferring curves of p-type TFTs fabricated by the related art and the present invention, respectively, and FIG. 9 shows transferring curves of n-type TFTs fabricated by the related art and the present invention, respectively.

As a result, on-current and field effect mobility of the TFT fabricated by the present invention are larger than those of other TFTs fabricated by the related art.

Thus, considering the above results, the TFT of the present invention is superior to other TFTs of the related art.

As mentioned in the above description, a TFT is fabricated by defining source and drain regions by carrying out impurity doping before the formation of a gate electrode, carrying out SLS crystallization to crystallize a silicon film, and forming a gate electrode.

In the present invention, characteristics of a TFT are improved as the whole surface of an active layer is crystallized to a single crystalline silicon state, as the doped silicon film is crystallized by SLS after defining the source and drain regions previously by impurity doping.

Moreover, the present invention simplifies the process of fabrication as the activation step may be skipped. The activation step is achieved naturally during crystallization after the impurity doping step.

It will be apparent to those skilled in the art that various modifications and variations can be made in a method of fabricating thin film transistors of the present invention without departing from the spirit or scope of the inventions. Thus, it is intended that the present invention cover the modifications and variations of this invention provided they come within the scope of the appended claims and equivalents.

What is claimed is:

1. A method of fabricating a thin film transistor comprising:

depositing an amorphous silicon film on a substrate;

doping the amorphous silicon film with impurities;

crystallizing the amorphous silicon film doped with the impurities by sequential lateral solidification;

forming an active layer including source and drain regions by patterning the silicon film crystallized by sequential lateral solidification; and forming a gate insulating layer and a gate electrode on the active layer.

2. The method according to claim 1, wherein the amorphous silicon film is selectively doped with the impurities.

3. The method according to claim 1, wherein the doped portions of the amorphous silicon film become the source and drain regions.

4. The method according to claim 1, wherein the substrate includes a buffer layer.

5. The method according to claim 1, further comprising:

forming a blocking layer on the amorphous silicon film, the blocking layer exposing portions of the amorphous silicon film; and selectively doping the amorphous silicon film with the impurities.

6. The method according to claim 5, wherein the portions exposed by the blocking layer include source and drain regions of the amorphous silicon film.

7. A method of fabricating a thin film transistor comprising:

depositing an active layer of amorphous silicon on a substrate;

defining source and drain regions in the active layer by selectively doping the active layer with impurities;

crystallizing the active layer of amorphous silicon doped selectively with the impurities by sequential lateral solidification;

forming a gate insulating layer and a gate electrode on the active layer crystallized by the sequential lateral solidification.

8. The method according to claim 7, further comprising:

forming a blocking layer on the amorphous silicon film, the blocking layer exposing portions of the amorphous silicon film; and selectively doping the amorphous silicon film with the impurities.

9. The method according to claim 7, wherein the substrate includes a buffer layer.

10. A method of fabricating a thin film transistor comprising:

depositing an amorphous silicon film on an insulating substrate;

forming a blocking layer on the amorphous silicon film, the blocking layer exposing portions of the amorphous silicon film to define source and drain regions;

selectively doping the exposed portions of the amorphous silicon film with impurities;

crystallizing the amorphous silicon film selectively doped with the impurities by sequential lateral solidification;

forming an active layer including the source and drain regions by patterning the silicon film crystallized by sequential lateral solidification; and forming a gate insulating layer and a gate electrode on the active layer.

11. The method according to claim 10, wherein the substrate includes a buffer layer.

* * * * *